(12) United States Patent
Coronati et al.

(10) Patent No.: US 9,711,879 B2
(45) Date of Patent: Jul. 18, 2017

(54) CLAMP INTERCONNECT (71) Applicant: Infinera Corp., Annapolis Junction, MD (US)

(72) Inventors: John Michael Coronati, Allentown, PA (US); Eugene Messenger, Kutztown, PA (US); Michael Sipics, Macungie, PA (US); Joseph Edward Riska, Macungie, PA (US); Jiaming Zhang, Macungie, PA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 14/452,197

(22) Filed: Aug. 5, 2014

(65) Prior Publication Data
US 2016/0043489 A1 Feb. 11, 2016

(51) Int. Cl.
*H01R 31/08* (2006.01)
*H01R 12/71* (2011.01)
*H01R 12/70* (2011.01)
*H01L 31/02* (2006.01)
*H05K 3/32* (2006.01)
*H01R 12/73* (2011.01)
*H05K 3/22* (2006.01)
*H05K 3/36* (2006.01)
*H05K 3/40* (2006.01)

(52) U.S. Cl.
CPC ..... *H01R 12/714* (2013.01); *H01L 31/02002* (2013.01); *H01R 12/7011* (2013.01); *H05K 3/325* (2013.01); *H01R 12/73* (2013.01); *H05K 3/225* (2013.01); *H05K 3/368* (2013.01); *H05K 3/4015* (2013.01); *H05K 2201/0373* (2013.01); *H05K 2201/068* (2013.01); *H05K 2201/09427* (2013.01); *H05K 2201/10121* (2013.01); *H05K 2201/10234* (2013.01); *H05K 2201/10378* (2013.01); *H05K 2201/10393* (2013.01); *H05K 2203/176* (2013.01)

(58) Field of Classification Search
CPC ...... H01R 31/08; H01R 31/085; H01R 43/26; H01R 4/38; H01R 12/714; H01R 12/73
USPC ......... 439/511, 65–67, 71, 73, 74, 506, 507, 439/509, 510, 513, 920, 261, 262, 717, 439/721; 174/250; 361/803
See application file for complete search history.

(56) References Cited

U.S. PATENT DOCUMENTS

| 4,004,195 A | 1/1977 | Harayda et al. |
| 5,130,888 A | 7/1992 | Moore |
| 5,329,426 A | 7/1994 | Villani |
| 5,883,782 A | 3/1999 | Thurston et al. |

(Continued)

*Primary Examiner* — Harshad Patel
(74) *Attorney, Agent, or Firm* — Dunlap Codding PC; David L. Soltz (57) ABSTRACT

An apparatus including a bridge member and a clamp is disclosed. The bridge member is positioned in a first plane and has a substrate with a first surface and a second surface; and a plurality of distinct conductive pillars formed on the second surface of the substrate. The clamp has a body, a proximal end and a distal end. The body is positioned in a second plane above the first plane with the second plane being within 2 degrees of parallel to the first plane. The proximal end is positioned along the second plane; and the distal end has a plurality of prongs. The distal end is offset from the second plane in a direction toward the bridge member such that each prong contacts the first surface of the substrate.

23 Claims, 6 Drawing Sheets

(56) References Cited

U.S. PATENT DOCUMENTS

| | | | | |
|---|---|---|---|---|
| 6,299,469 B1* | 10/2001 | Glovatsky | ................ | F02D 9/02 |
| | | | | 439/329 |
| 7,232,324 B2* | 6/2007 | Oesterhaus | .......... | H01R 4/4827 |
| | | | | 439/268 |
| 7,341,476 B2* | 3/2008 | Soeta | .................... | H01R 12/61 |
| | | | | 439/493 |
| 7,618,283 B1* | 11/2009 | Costello | ............... | H01R 12/585 |
| | | | | 439/511 |
| 7,963,796 B2* | 6/2011 | Sypolt | .................... | H01R 12/58 |
| | | | | 439/511 |
| 8,118,611 B2* | 2/2012 | Jeon | ..................... | H01R 12/523 |
| | | | | 439/511 |
| 2006/0113109 A1* | 6/2006 | Koga | .................... | H01R 12/62 |
| | | | | 174/261 |
| 2007/0298641 A1* | 12/2007 | Yamamoto | ............. | H01R 12/52 |
| | | | | 439/260 |
| 2010/0327405 A1* | 12/2010 | Behun | ............... | H01L 23/49811 |
| | | | | 257/531 |

* cited by examiner

CLAMP INTERCONNECT

BACKGROUND

Interconnect technologies within the integrated optical circuits generally use solder connections to achieve electrical communication between circuits. For example, current flip-chip and pillar to pad interconnects are soldered. These connections, however, may suffer due to high shear stress resulting from the coefficient of thermal expansion (CTE) mismatch. As such, there may be an increase in interconnection defects. Alternatively, wire bonds may be used to for interconnection between integrated circuits. While cost effective, wire bonds may limit the speed of the device.

Even further, the use of solder generally makes such connections permanent, and such permanent connections may be costly. For example, a solder connection to a photonic integrated circuit (PIC) may limit rework of the device or replacement of the device within a system. Full replacement cost of a PIC may be costly during production.

SUMMARY

A method and system are disclosed. The problem of electrically connecting two components of an integrated optical circuit, with each component having different coefficients of thermal expansion is addressed through methods and systems utilizing a clamp interconnect. The clamp provides a force to an interposer, with the interposer electrically connecting the components. A filler metal is positioned between each component and the interposer. The filler metal provides a solderless connection between the interposer and each of the components. The solderless connection can expand and contract allowing for the interposer to be capable of movement about the filler metal. Such movement allows for the interconnect, connected to components having different CTEs, to expand and contract without interruption of the electrical connection between the interposer and each of the components.

BRIEF DESCRIPTION OF THE SEVERAL VIEWS OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing.

DETAILED DESCRIPTION

The mechanisms and systems proposed in this disclosure circumvent the problems described above. The present disclosure describes methods and systems for providing electrical communication between components of an integrated optical circuit.

In one example, an electro-optical system may include a first component and a second component. Each component may include a plurality of electrical contacts. An interconnection system may be used to provide electrical communication between the first component and the second component. The interconnection system may include a bridge member, and a clamp. The bridge member may include a substrate having plurality of pillars positioned thereon. The pillars may be aligned with the electrical contacts of the first component and the second component. Filler metal formations may be positioned between the pillars and electrical contacts such that the bridge member is in electrical communication with the first component and the second component. The clamp may provide a force bearing on a surface of the interposer providing the filler metal formations in a solderless connection with the pillars of the bridge member.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The systems and methods as described in the present disclosure are capable of other embodiments or of being practiced or carried out in various ways. Also, it is to be understood that the phraseology and terminology employed herein is for purposes of description, and should not be regarded as limiting.

The following detailed description refers to the accompanying drawings. The same reference numbers in different drawings may identify the same or similar elements.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements, but may also include other elements not expressly listed or inherent to such process, method, article, or apparatus.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, any reference to "one embodiment," "an embodiment," "some embodiments," "one example," "for example," or "an example" means that a particular element, feature, structure or characteristic described in connection with the embodiment is included in at least one embodiment. The appearance of the phrase "in some embodiments" or "one example" in various places in the specification is not necessarily all referring to the same embodiment, for example.

Figure 1:
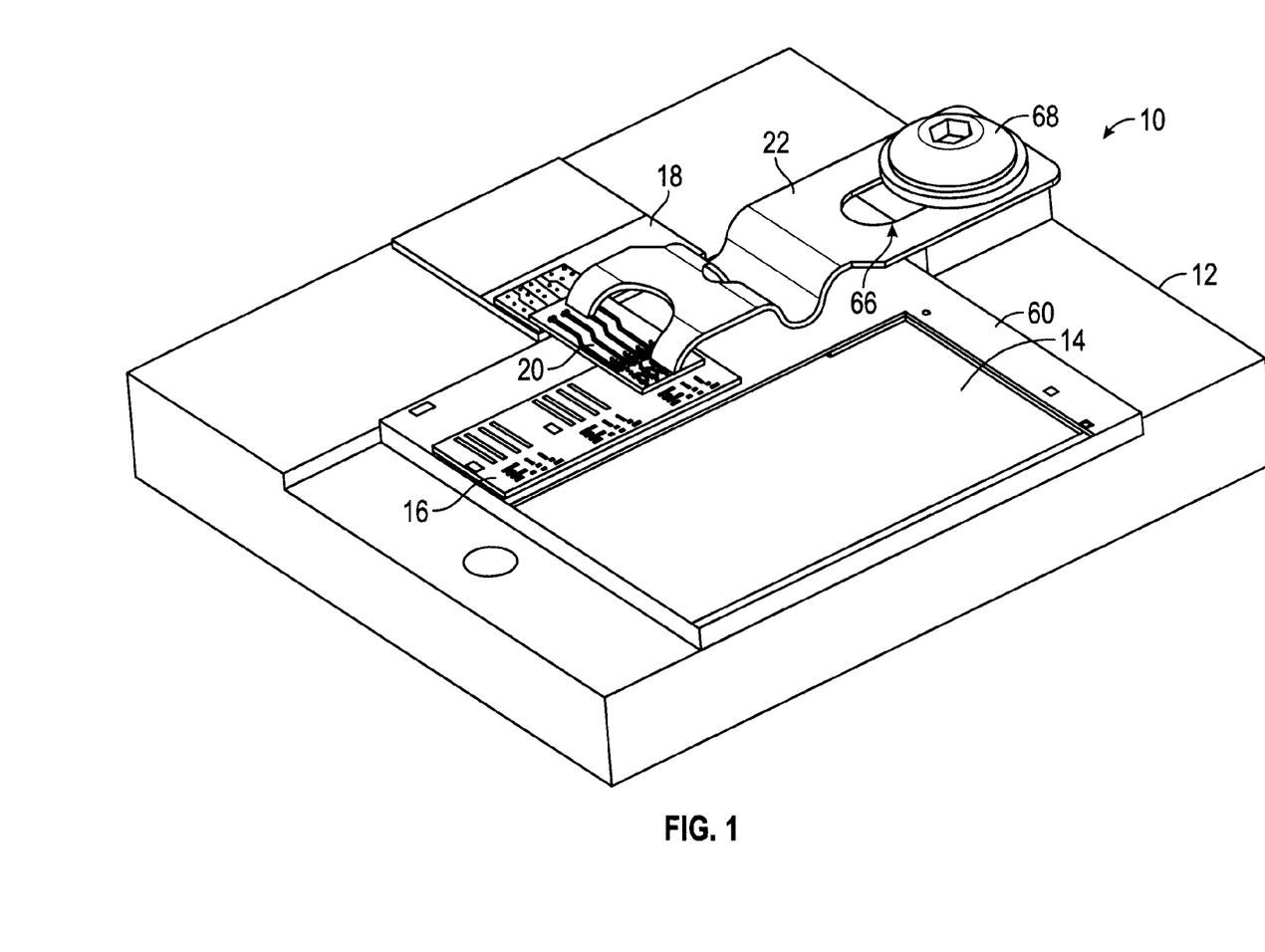
FIG. 1 is a perspective view of an exemplary electro-optical system in accordance with the present disclosure.

Referring now to the Figures, and in particular to FIG. 1, shown therein and designated by reference numeral 10 is an electro-optical system 10 having a substrate 12 housing a plurality of integrated circuits and microdevices. The substrate 12 may support and accommodate a plurality of optical and/or electrical components including, but not limited to, photonic integrated circuit(s), application specific integrated circuit(s), interposer(s), and the like. The substrate 12 may be formed of materials including, but not limited to, silicon, silicon-germanium, glass, indium phosphide and the like. Additionally, formation of the electro-optical system 10 having the plurality of integrated circuits may include one or more microfabrication process steps including, but not limited to, doping, ion implantation, etching, deposition, photolithography, imprint lithography, electron beam, immersion lithography, extreme ultraviolet lithography, electron beam lithography, focused ion beam lithography, and the like.

Referring to FIG. 1, in some embodiments, the substrate 12 may house one or more interposer(s) 14, one or more photonic integrated circuit(s) (PIC) 16, one or more application specific integrated circuit(s) (ASIC) 18, and one or more bridge member(s) 20. Generally, the interposer 14 may be constructed of silicon and provide one or more signals to the PIC 16. Communication between the PIC 16 and the ASIC 18 may be facilitated via the bridge member 20. A clamp 22 may be used to apply a force to the bridge member 20 securing electrical communication between the PIC 16 and the ASIC 18 as discussed in further detail herein.

Although the current disclosure discusses the use of the clamp 22 to secure engagement between many distinct pairs of electrical conductors to establish and maintain electrical communication between the PIC 16 and ASIC 18, it should be apparent that the clamp 22 may be used to apply force to the bridge member 20 to secure communication between other integrated circuits or components of the electro-optical system 10. For example, the clamp 22 may be used to apply force to the bridge member 20 to secure electrical communication between distinct pairs of electrical conductors of the PIC 16 and an additional interposer in some embodiments. Also, it should be noted that the bridge member 20 may be an interposer. In some embodiments, the bridge member 20 may be a high frequency interposer (RF interposer), for example.

Figure 2:
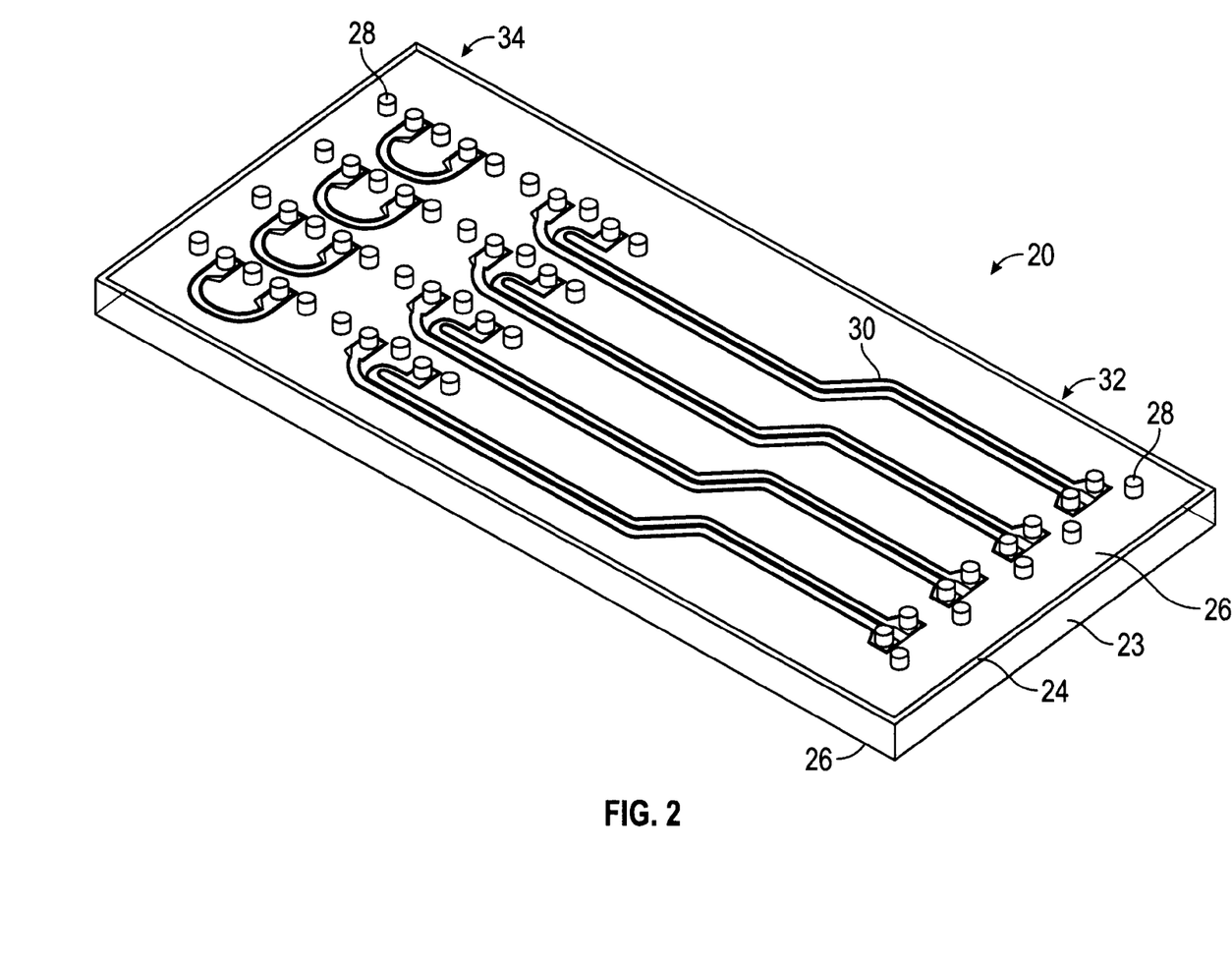
FIG. 2 is a perspective view of an exemplary bridge member for use in the electro-optical system of FIG. 1.

Referring to FIGS. 1 and 2, the bridge member 20 may facilitate electrical communication between two or more components of the electro-optical system 10. For example, the bridge member 20 may facilitate electrical communication between the PIC 16 and the ASIC 18 as described in further detail herein. It should be noted that electrical communication between the PIC 16 and the ASIC 18 is established such that electrons may flow between the PIC 16 and ASIC 18 when voltages suitable for powering, grounding and/or providing control signals or data, for example, between the PIC 16 and/or the ASIC 18 is applied, and may not require the continuous active flow of electrons.

Referring to FIG. 2, the bridge member 20 may include a substrate layer 23 having a first surface 24 and a second surface 26. The substrate layer 23 may be formed of glass, for example. The first surface 24 of the substrate layer 23 may include a plating layer 27, a plurality of pillars 28, and a plurality of conductors or conductive traces 30. The plating layer 27 may be formed of a gold material, for example.

The bridge member 20 may include a first end 32 and a second end 34. Pillars 28 may be positioned at the first end 32 and the second end 34 of the bridge member 20 with the conductors or conductive traces 30 connecting pillars 28 between the first end 32 and the second end 34 as illustrated in FIG. 2. Pillars 28 may be formed of materials including, but not limited to, electrically conductive materials, such as gold, silver, copper, nickel, zinc, aluminum, combinations and/or alloys thereof, and/or the like.

Figure 3A:
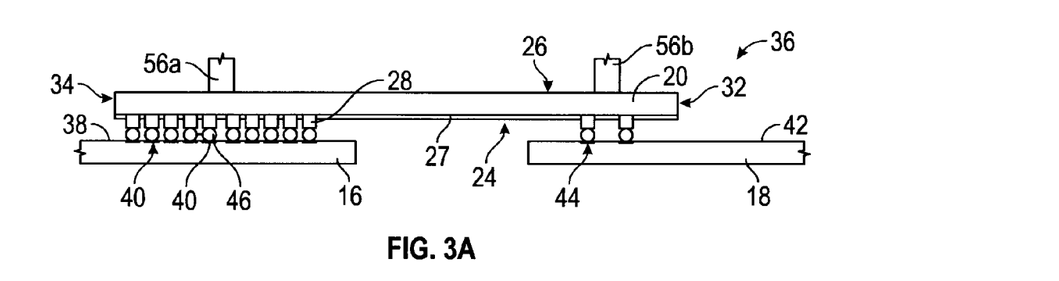
FIGS. 3A-3C are side views of exemplary interconnection systems for use in the electro-optical system illustrated in FIG. 1.
Figure 3B:
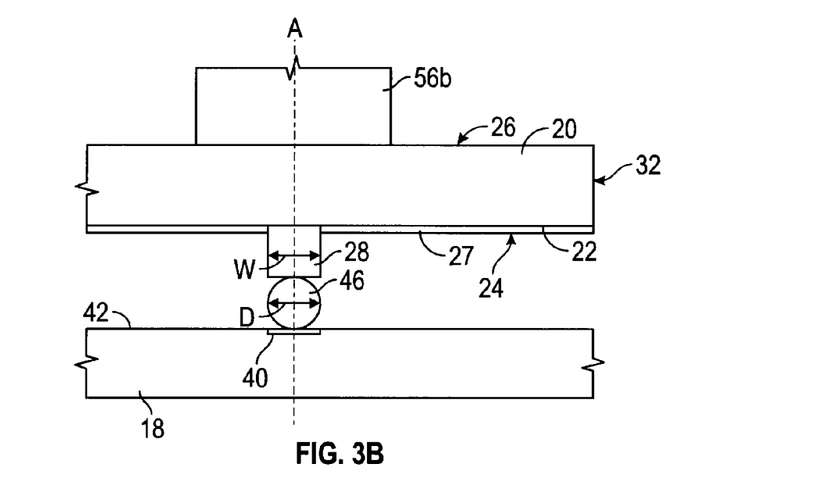
Figure 3C:
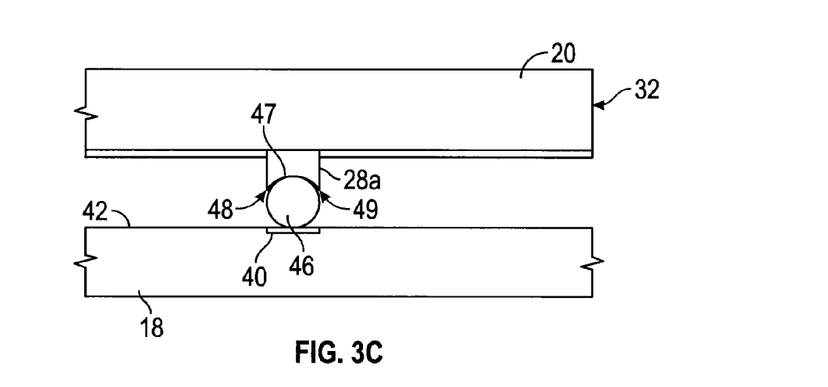

Referring to FIGS. 3A-3C, an interconnection system 36 may be formed with the bridge member 20 positioned in electrical communication with the PIC 16 and the ASIC 18. The PIC 16 includes a surface 38 having a plurality of electrical contacts 40 positioned thereon. Similarly, the ASIC 18 includes a surface 42 having a plurality of electrical contacts 44 positioned thereon. Electrical contacts 40 and 44 may be formed of electrically conducive materials including, but not limited to, copper, silver, aluminum, gold, combinations and/or alloys thereof and/or the like. In some embodiments, the electrical contacts 40 and 44 may be formed of different materials. For example, the PIC 16 may include electrical contacts 40 formed of gold as the PIC 16 may be associated with higher temperature applications, while the ASIC 18 may include electrical contacts 44 formed of aluminum based on cost considerations.

The pillars 28 at the first end 32 of the bridge member 20 may be positioned in electrical communication with the electrical contacts 44 positioned on the surface 42 of the ASIC 18 to form distinct pairs of electrical conductors. Similarly, pillars 28 at the second end 34 of the bridge member 20 may be positioned in electrical communication with electrical contacts 40 on the surface 38 of the PIC 16.

In some embodiments, a filler metal 46 may be positioned between the pillars 28 and electrical contacts 40 and 44. For example, as illustrated in FIG. 3B, filler metal 46 may be positioned between the pillar 28 and the electrical contact 40 on the surface 42 of the ASIC 18. In some embodiments, the filler metal 46 may be ball bonded onto the electrical contacts 40 and 44. For example, a ball of filler metal 46 may be ball bonded onto each electrical contact 40 and 44. The filler metal 46 may then be aligned with each pillar 28 of the bridge member 20 to provide an interconnect between the pillar 28 and the electrical contacts 40 and 44. The interconnect between the pillar 28 and the electrical contacts 40 and 44 may be capable of expanding and contracting such that the bridge member 20 may moveable relative to the filler metal 46 forming a solderless, moveable attachment between the pillars 28 and the electrical contacts 40 and 44. Filler metal 46 may be formed of materials including, but not limited to, gold.

Filler metal 46 may be formed in any shape capable of providing electrical communication between the pillars 28 and the electrical contacts 40. For example, each filler metal 46 may be formed in a shape providing a single point of contact to each pillar 28. For example, in some embodiments, the filler metal 46 may be formed in a ball such that a single point of contact is provided between the filler metal 46 and the pillar 28. In some embodiments, the filler metal 46 may be formed in a ball shape having a diameter D. Generally, the diameter D of the filler metal 46 may be less than the width W of the pillar 28. For example, in some embodiments the width of the pillar may be approximately 100 μm with the diameter D of the filler metal 46 being approximately 42 μm.

In some embodiments, moveable attachment provided by the filler metal 46 between the pillars 28 and the electrical contacts 40 and 44 may be such that shear stress is reduced. For example, the bridge member 20 connecting two components having different coefficient of thermal expansions (CTE) may increase shear stress in a stationary attachment; however, filler metal 46 may facilitate and/or form a moveable attachment in that the pillars 28 may be able to move relative to the electrical contacts 40 while the interconnection system 36 continues to provide, without interruption, electrical communication between the pillars 28 and electrical contacts 40 and 44.

As described herein, the filler metal 46 may provide a moveable attachment between the pillars 28 and the electrical contacts 40 and 44. To that end, in some embodiments, a center of the pillar 28 may be capable of movement away from an axis A at a distance of 1-5 μm while still retaining electrical communication between the interconnection system 36. Generally, the center of the pillar 28 may be capable of movement away from the axis A at a distance less than the diameter D of the filler metal 46. In one example, the pillar may be approximately 100 μm with the diameter D of the filler metal 46 being approximately 42 μm. In this example, the center of the pillar 28 may be capable of movement away from the axis A at a distance between 20 μm in any direction away from the center.

FIG. 3C illustrates another exemplary embodiment of a pillar 28a in accordance with the present disclosure. The pillars 28a may include a surface 47 in contact with the filler metal 46. In some embodiments, the surface 47 may be formed in a concave shape having a first edge 48 and a second edge 49 such that the filler metal 46 may be contained within the first edge 48 and the second edge 49 of the pillar 28a.

Figure 4A:
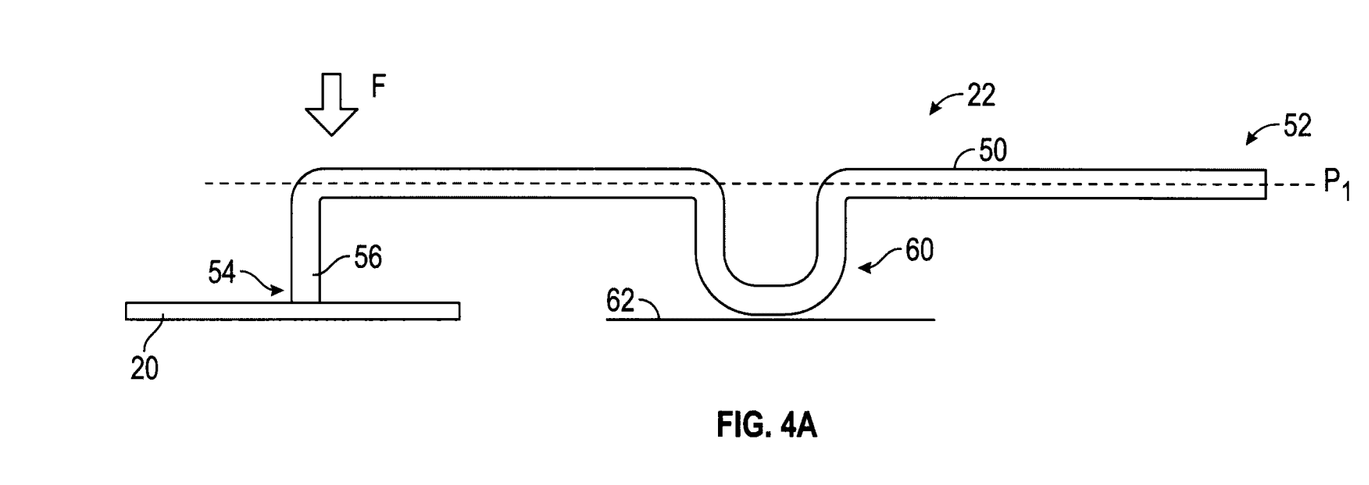
FIG. 4A is a side view of the clamp illustrated in FIG. 1.
Figure 4B:
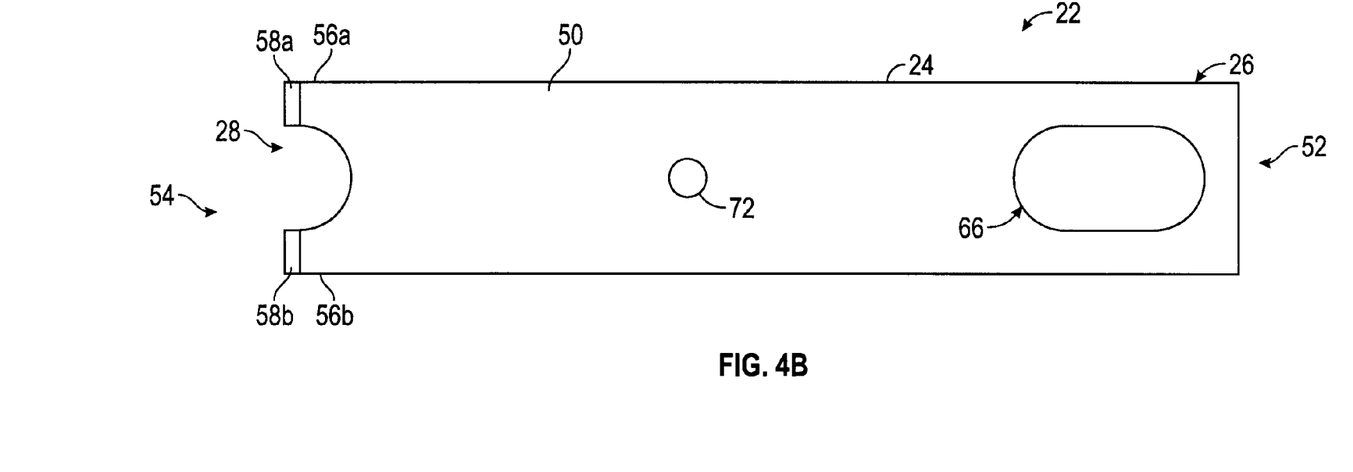
FIG. 4B is a top down view of the clamp illustrated in FIG. 1.

FIGS. 4A and 4B illustrate a side view and a top down view of the clamp 22 of FIG. 1, respectively. The clamp 22 may provide a force F to the bridge member 20 to establish and maintain secure electrical communication between the pillars 28 and electrical contacts 40 and 44 shown in FIGS. 3A-3C.

The clamp 22 comprises a body 50 having a proximal end 52 and a distal end 54. The proximal end 52 is coupled in a fixed relation to a first component of the electro-optical system 10 and a second component of the electro-optical system 10. For example, the proximal end 52 may be coupled in a fixed relation to the PIC 16 and the ASIC 18 as illustrated in FIG. 1. The clamp 22 may be formed of materials including spring steel, for example.

The body 50 and the proximal end 52 of the clamp 22 may lie within the same plane $P_1$. The distal end 54 may deviate from the plane $P_1$ in the direction of the electro-optical system 10 when in use. For example, the distal end 54 may deviate from the plane $P_1$ in the direction of the PIC 16 and the RF interposer as illustrated in FIG. 1.

In some embodiments, the body 50 of the clamp 22 may be positioned in the plane $P_1$ and the bridge member 20 may be positioned in a plane parallel to the plane $P_1$. The parallel plane may be positioned below the plane $P_1$. Offset between the plane $P_1$ and the parallel plane may be within 0-2 degrees of parallel. The distal end 54 of the body 50 may be offset from the plane $P_1$ towards the parallel plane.

The distal end 54 of the clamp 22 exerts a force F on the bridge member 20 in the direction of the first component of the electro-optical system 10 and the second component of the electro-optical system 10. For example, the distal end 54 of the clamp 22 exerts the force F on the bridge member 20 in the direction of the PIC 16 and the RF interposer in the electro-optical system 10 illustrated in FIG. 1. In some embodiments, the force F may be a constant force applied to the bridge member 20.

Figure 5:
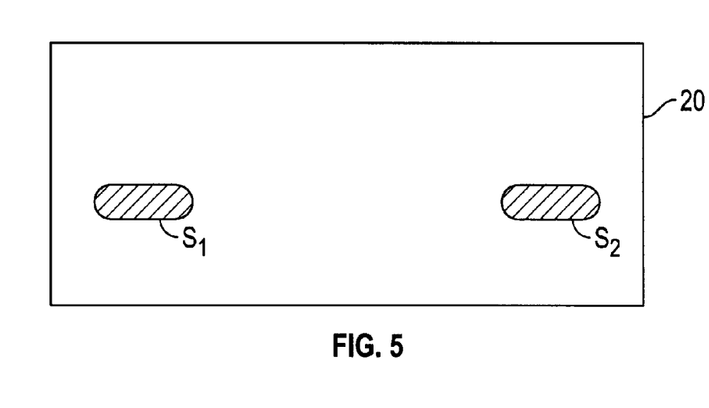
FIG. 5 is a top down view of a bridge member illustrating contact areas of a plurality of prongs of a clamp.

The distal end 54 of the clamp 22 may include a plurality of prongs 56. For example, the distal end 54 of the clamp 22 in FIGS. 4A and 4B includes a first prong 56a and a second prong 56b. Each prong 56 may include a surface 58. For example, the first prong 56a includes a surface 58a and the second prong 56b includes the surface 58b. Each surface 58a and 58b may contact the bridge member 20 to apply the force F. Size and shape of each surface 58a and 58b may be determined such that the force F applied to the bridge member 20 provides electrical communication between the bridge member 20 and the components of the electro-optical components as described in accordance with the present disclosure. For example, FIG. 5 illustrates exemplary areas of applied force $S_1$ and $S_2$ to the bridge member 20 from the prongs 56a and 56b, respectively, of the clamp 22 of FIGS. 4A and 4B. Generally, contact force may be determined such that an average contact force is approximately 94 g per pillar 28 on the bridge member 20.

Referring to FIGS. 1 and 4A, in some embodiments, at least one portion 60 of the body 50 may be offset from the plane $P_1$ in the same direction as the distal end 54. For example, FIG. 4A illustrates the portion 60 as a concave trough offset from the plane $P_1$ in the same direction as the distal end 54 of the clamp 22. The portion 60 may be shaped to provide a point of contact between the clamp 22 and a surface 62 of the electro-optical system 10 illustrated in FIG. 1. Although the portion 60 is illustrated as a concave trough, it should be noted that the portion 60 may be any shape and size capable of providing contact with a portion of the electro-optical system 10 of FIG. 1. It is also contemplated that additional portions 60 may be included within the body 50 and offset from the plane $P_1$ providing additional points of contact between the clamp 22 and the surface 58 of the electro-optical system 10.

Referring to FIGS. 1 and 4B, the proximal end 52 of the body 50 of the clamp 22 may include a clamp screw system 64. The clamp screw system 64 may include an opening 66 and a fixation device 68. The clamp 22 may be locked into position on the electro-optical system 10 by threading the fixation device 68 through the opening 66.

Figure 6:
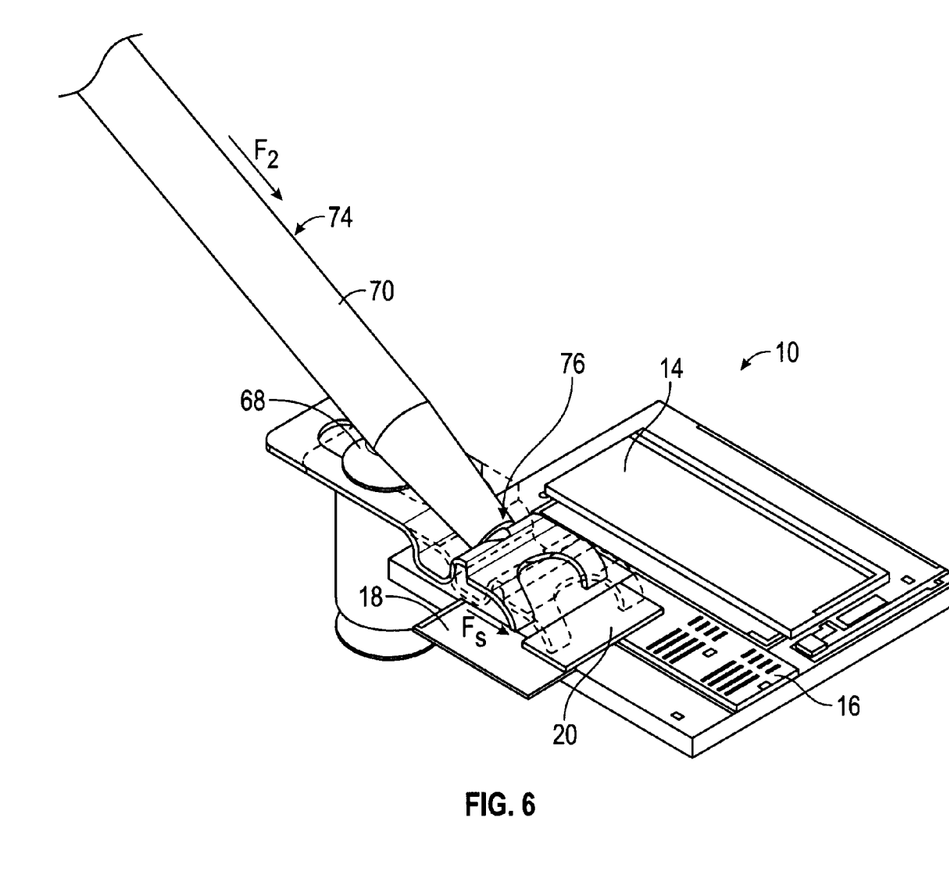
FIG. 6 is a perspective view of an exemplary insertion system for use in positioning a clamp in the electro-optical system of FIG. 1.

Referring to FIGS. 4B and 6, positioning of the clamp 22 may be adjusted relative to the components of the electro-optical system 10 using an insertion device 70. For example, positioning of the clamp 22 relative to the PIC 16 and ASIC 18 of the electro-optical system 10 may be adjusted using the insertion device 70 illustrated in FIG. 6. In some embodiments, the insertion device 70 may be positioned on an opening 72 on the body 50. For example, the insertion device 70 may include a proximal end 74 and a distal end 76. The proximal end 74 may include a handle for use by a user, wherein the term "user" may be a person or a robot. The distal end 76 may be formed to fit in the opening 72 or secure to an opening on the body 50 of the clamp 22. For example, in FIG. 4B the opening 72 is positioned on the portion 60 of the body 50 having a concave trough. The distal end 76 of the insertion device 70 may be positioned in the opening 72 such that force $F_2$ applied to the opening 72 may be used to position the clamp 22 relative to the PIC 16 and ASIC 18. Once positioned, the fixation device 68 may be threaded through the opening 66 and tightened to secure the clamp 22 in position.

From the above description, it is clear that the inventive concept(s) disclosed herein are well adapted to carry out the objects and to attain the advantages mentioned herein, as well as those inherent in the inventive concept(s) disclosed herein. While the embodiments of the inventive concept(s) disclosed herein have been described for purposes of this disclosure, it will be understood that numerous changes may be made and readily suggested to those skilled in the art which are accomplished within the scope and spirit of the inventive concept(s) disclosed herein.

What is claimed is:

1. An apparatus, comprising:
a first component of an electro-optical system, the first component having a plurality of electrical contacts;
a second component of the electro-optical system, the second component having a plurality of electrical contacts;
an interconnection system comprising:
a bridge member having:
a substrate with a first surface and a second surface, the first surface extending from a first end to a second end;
a plurality of first pillars positioned on the first surface of the first end and aligned with electrical contacts of the first component;
a plurality of second pillars positioned on the first surface of the second end and aligned with electrical contacts of the second component;
conductive traces connecting the first pillars to the second pillars, the first and second pillars being constructed of at least one conductive material;
a clamp having:
a body having a first portion coupled in a fixed relation to the first component and the second component of the electro-optical system; and
a second portion bearing on the second surface of the bridge member,
wherein the first portion of the body is a proximal end, and the second portion of the body is a distal end, and wherein the body and the proximal end of the clamp are co-planar, and the distal end of the clamp is non-planar with the body and the proximal end.

2. The apparatus of claim 1, further comprising:
a plurality of first filler metal formations positioned between the first pillars of the bridge member and electrical contacts of the first component such that the bridge member is in electrical communication with the first component; and
a plurality of second filler metal formations positioned between the second pillars of the bridge member and electrical contacts of the second component such that the bridge member is in electrical communication with the second component.

3. The apparatus of claim 2, wherein each of the plurality of first filler metal formations has a ball shape.

4. The apparatus of claim 3, wherein each of the plurality of first filler metal formations has a diameter that is less than a width of each of the plurality of first pillars.

5. The apparatus of claim 3, wherein each of the plurality of first pillars has an edge having a concave shape that receives a corresponding one of the plurality of first filler metal formations.

6. The apparatus of claim 1, wherein a distal end of the clamp includes a plurality of prongs, each prong exerts a force on the bridge member in a direction toward the first component and the second component.

7. The apparatus of claim 1, wherein the first component is a photonic integrated circuit device integrating multiple photonic functions and the second component is a high frequency interposer having an electrical interface routing a plurality of connections.

8. The apparatus of claim 1, wherein the first component is a photonic integrated circuit device integrating multiple photonic functions and the second component is an application specific integrated circuit device custom designed for a specific application.

9. The apparatus of claim 1, wherein each pillar has a first width, and each filler metal formation has a second width with the second width being less than the first width.

10. The apparatus of claim 1, wherein the first pillars are formed of copper.

11. The apparatus of claim 1, wherein the body has a plane intersecting the body and the proximal end, and wherein the body includes at least one portion offset from the plane in a direction from the proximal end toward the distal end.

12. The apparatus of claim 11, wherein the portion offset from the plane in the direction is shaped as a concave trough in the body.

13. The apparatus of claim 12, wherein the body is shaped to form an opening in the portion shaped as the concave trough, and the interconnection system further comprises:
an insertion tool having a proximal end and a distal end, the distal end of the insertion tool formed to fit within the opening positioned in the surface of the portion shaped as the concave trough.

14. The apparatus of claim 1, wherein the clamp comprises a clamp screw extending through the first portion of the body.

15. The apparatus of claim 1, wherein electrical communications between the electrical contacts of the first component to the first pillars of the bridge member are solderless.

16. An apparatus comprising:
a bridge member positioned in a first plane, the bridge member having:
a substrate with a first surface and a second surface; and
a plurality of distinct conductive pillars formed on the second surface of the substrate;
a clamp having:
a body positioned in a second plane above the first plane, the second plane within 2 degrees of parallel to the first plane;
a proximal end positioned along the second plane; and
a distal end having a plurality of prongs, the distal end offset from the second plane in a direction toward the bridge member such that each prong contacts the first surface of the substrate.

17. The apparatus of claim 16, wherein the body includes at least one portion offset from the second plane in a direction from the proximal end toward the distal end.

18. The apparatus of claim 17, wherein the portion offset from the second plane is shaped to form a concave trough in the body.

19. The apparatus of claim 18, wherein the body is shaped to form an opening in the portion shaped as the concave trough.

20. The apparatus of claim 19, further comprising:
an insertion tool having a proximal end and a distal end, the distal end of the insertion tool formed to fit within the opening positioned in the surface of the portion shaped as the concave trough.

21. The apparatus of claim 16, wherein the proximal end of the clamp comprises a clamp screw.

22. The apparatus of claim 21, wherein the clamp screw is attached to a substrate.

23. The apparatus of claim 16, wherein the bridge member has a first set of conductive pillars having a first pattern matching a pattern of electrical conductors of a photonic integrated circuit, and a second set of conductive pillars having a second pattern matching a pattern of electrical conductors of a high frequency interposer.

* * * * *